United States Patent [19]

Lavergnat et al.

[11] Patent Number: 4,670,712

[45] Date of Patent: Jun. 2, 1987

[54] FREQUENCY MEASUREMENT METHOD AND DEVICE

[75] Inventors: Jacques Lavergnat; Monique Dechambre, both of Issy les Moulineaux, France

[73] Assignee: Etat Francais, Issy les Moulineaux, France

[21] Appl. No.: 699,689

[22] Filed: Feb. 11, 1985

[30] Foreign Application Priority Data

Feb. 14, 1984 [FR] France ................................ 84 02228

[51] Int. Cl.$^4$ ............................................ G01R 23/00
[52] U.S. Cl. ................................ 324/78 R; 324/79 D
[58] Field of Search .................. 324/78 R, 78 D, 78 F, 324/79 R, 79 D, 77 D, 77 E, 57 N; 307/520, 522; 328/140, 137, 162, 165; 364/484; 343/17.7

[56] References Cited

U.S. PATENT DOCUMENTS 2,911,641 11/1959 Kohler .............................. 324/79 D
3,403,338 9/1968 Martin .............................. 324/79 D Primary Examiner—Michael J. Tokar
Attorney, Agent, or Firm—Antonelli, Terry & Wands

[57] ABSTRACT

For measuring the frequency of a sine shaped signal accompanied by noise, for example Gaussian noise, in an input signal, that input signal is applied to two measuring arms, possibly after heterodyning. One arm includes a counter for counting the zero crossings of the signal. The other arm includes a derivator and a second counter for counting zero crossings. A processing circuit determines the frequency and the signal-to-noise ratio from the measurements.

11 Claims, 2 Drawing Figures

FREQUENCY MEASUREMENT METHOD AND DEVICE

BACKGROUND AND SUMMARY OF THE INVENTION

The invention relates to the measurement of the frequency of a signal buried in background noise and it is suitable for use in metrology, in particular radar, velocity meters and systems including a phase-locked loop where the difference between the frequency of a useful signal and a reference frequency should be measured.

The mathematical expression of the mean number of zero-crossings of a sine signal buried in Gaussian noise is well known. However, this expression includes, in addition to the frequency, two other parameters, the pass band of the filter which is applied to the process, a priori known, and the signal-to-noise ratio, which is unknown in most cases; consequently that type of analysis is hardly useful in most cases. Moreover, there is no suitable method of evaluating the error in measuring the frequency by counting since the error too depends on the above-mentioned parameters.

Consequently, the prior art methods make it possible to measure the frequency of a signal accompanied by noise when the signal-to-noise ratio is low (less than 0 dB) only through the use of elaborate indirect techniques (fast Fourier transform, correlation) which alone give the actual value of the signal-to-noise ratio and the frequency. Reference may be had in that respect to IEEE Transactions on aerospace and electronic systems, Vol. AES-10, No. 3, May 1974, pp. 364–371; U.S. Pat. No. 3,094,666 (Smith); and Telecommunications and radio engineering, Vol. 25, No. 5, May 1970, pp. 84–88.

GENERAL DESCRIPTION OF THE INVENTION

It is an object of the invention to improve upon the prior art method and apparatus for measuring the frequency and the signal-to-noise ratio of an unknown signal accompanied by noise. It is a particular object to provide a process and apparatus which are simple and make it possible to evaluate the accuracy of the measurements.

According to the invention, a method of measuring the frequency of a sine-shaped signal accompanied by noise of known nature, for example Gaussian, in an input signal, comprises the steps of: counting the number of zero crossings of the input signal during a predetermined time interval; generating the derivative or integral function of the input signal; counting the number of zero crossings of said function during said time interval, and computing the value of the frequency from the two counts.

In most cases, the noise will be Gaussian in nature. However, other noise distribution may exist and it is only necessary to know what is the nature, while the noise power and spectrum may remain unknown. The second counting is preferably carried out on the derivative of the signal affected by noise, for easier implementation. However, this is not essential.

Before the zero crossings are counted, the noise-affected input signal to be treated is subjected to filtering for retaining only a band width $\Delta\omega$. Band pass or low pass filtering may be used. Each time that an approximation $\Omega_0$ of the frequency to be measured $\omega_0$ is known (which is, for example, the case when it is desired to measure the frequency $\omega_0$ of an echo from a radar pulse transmitted at frequency $\Omega_0$), the frequency to be measured is advantageously brought back to a value close to zero by heterodyning by means of signal $\Omega_0$. By relating the measurements carried out to $\Delta\omega$ (a band width from zero), the computations are quite general in nature and determination of $\Delta\omega$ is rendered more convenient by reference to a small number of charts or nomograms or the construction of a device which then accepts signals in a wide frequency range. A final low pass filter may be provided for processing the heterodyned signal.

The invention will be better understood from the following description of a method and a device which constitute a particular embodiment, given by way of example only.

THEORETICAL BASIS

Figure 1:
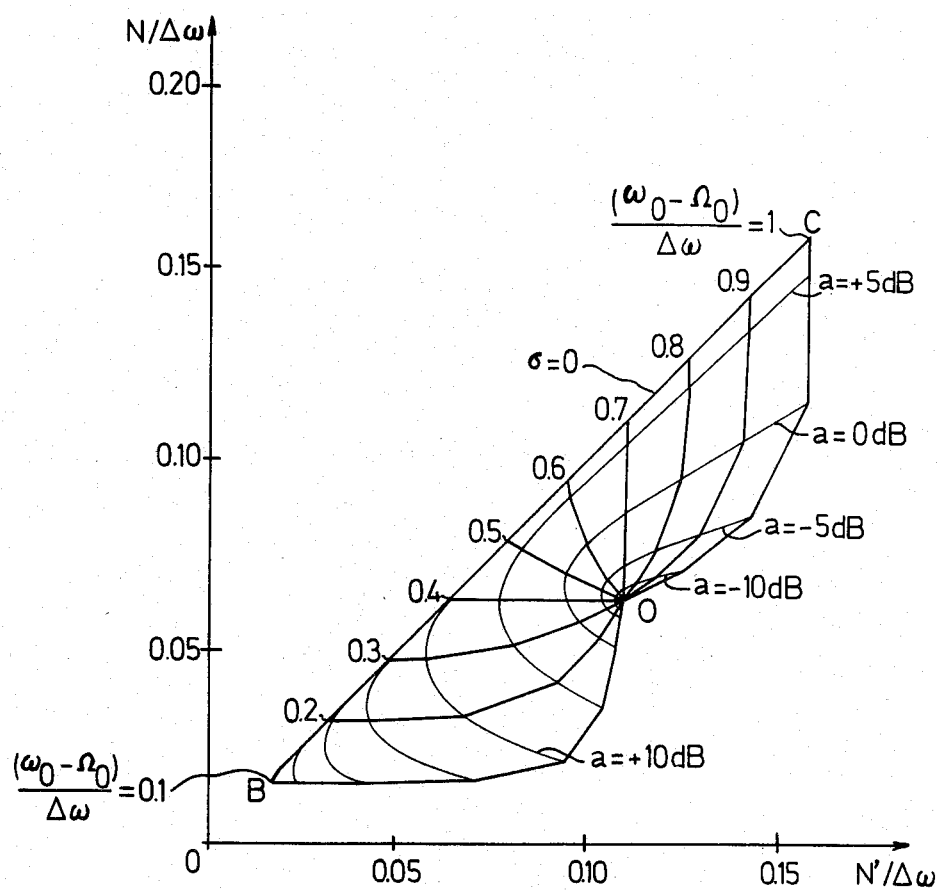
FIG. 1 is a nomogram for determination of the values of the frequency $\omega_0$ and of the signal-to-noise ratio a from the measurement of the mean numbers of zero crossings per unit time of the noise-containing input signal and its derivative.

Before the actual steps of the method are described, the theoretical approach adopted for the measurement of the frequency and of the signal-to-noise ratio will be explained.

Two unknown parameters have to be determined, the angular frequency or pulsation $\omega_0$ and the signal-to-noise ratio a (ratio of the amplitude A of the useful sine signal to the amplitude $\sigma$ of the noise).

Consequently, it is necessary to have two measurements available, preferably corresponding to the same time interval T.

The first measurement is that of the number of zero crossings per unit time of the noise-containing input signal. The second measurement can relate to the derivative or the integral of the signal. As indicated above, it will be generally more advantageous to differentiate the signal. It will be assumed that this approach is adopted in the following description.

The numbers N of zero crossings of the signal per unit time and N' of the derivative of the signal depend on the same parameters $\omega_0$ and a. By way of example, for a random phenomenon consisting of a Gaussian noise whose power spectrum is $F(\omega_0)$ and of a harmonic signal of angular frequency $\omega_0$, N and N' can be represented by the expressions (1) and (2) below, which are functions of $\omega_0$, of a and of the power spectrum $F(\omega)$ of a filter placed at the input of the apparatus.

$$N = \frac{\omega_1}{2\pi} \left[ e^{-\alpha} I_0(\beta) + \frac{b^2}{2a} I_e\left(\frac{\beta}{\alpha}, \alpha\right) \right] \quad (1)$$

$$N' = \frac{1}{2\pi} \frac{\omega_2}{\omega_1} \left[ e^{-\gamma} I_0(\delta) + \frac{C_2}{2\nu} I_e\left(\frac{\delta}{\gamma}, \gamma\right) \right] \quad (2)$$

In formulas (1) and (2), $\omega_1$ and $\omega_2$ are constants whose values can be determined by calculation from $F(\omega)$:

$$\omega_1{}^2 = \frac{\int_0^\infty \omega^2 F(\omega)d\omega}{\int_0^\infty F(\omega)d\omega} \qquad \omega_2{}^2 = \frac{\int_0^\infty \omega^4 \cdot F(\omega)d\omega}{\int_0^\infty F(\omega)d\omega}$$

The coefficients b, c, $\alpha$, $\beta$, $\gamma$ and $\delta$ are given by:

$$b = a \frac{\omega_0}{\omega_1} \; ; \; c = \delta \frac{\omega_0{}^2}{\omega_2}$$

$$\alpha = \frac{a^2 + b^2}{4} \; ; \; \beta = \frac{a^2 - b^2}{4} \; ; \; \gamma = \frac{b^2 + c^2}{4} \; ; \; \delta = \frac{b^2 - c^2}{4} \; ;$$

Finally, the factors $I_e$ are of the form:

$$I_e(k,x) = I_e(-k,x) = \int_0^x e^{-u} I_0(ku)du$$

It is immediately verified that for a=0 (white noise), and when a tends towards infinity (pure sine signal), the known values are again found, respectively $$N = \omega_1/2\pi, \; N' = (\tfrac{1}{2}\pi)\cdot(\omega_2/\omega_1) \text{ and } N = N' = \omega_0/2.$$

DESCRIPTION OF A PREFERRED EMBODIMENT

The method according to the invention is derived from these results. It will be advantageous, in order that the method may be applied without modification of the constants at different frequencies, to carry out standardization, that is to say to determine relative values.

For this, the first step of the method will consist of processing the signal by heterodyning so as to bring back the frequency to be measured to a value close to zero.

This operation does not in any way spoil the generality of the method. Whatever the frequency $\omega_0$, it will always be possible to determine therefrom an approximate value and it will be possible to limit the search for this frequency to a band $\Delta\omega$ around the value 0 by selecting a suitable reference frequency $\Omega_0$ (frequency of the heterodyne generator).

However, the choice of reference frequency will be facilitated when it occurs in the case when the signal to be processed is derived from a transmitter at frequency $\Omega_0$, is accompanied by noise and has a frequency which has become $\omega_0$ with a signal/noise ratio equal to a. In this case, $\Omega_0$ will be adopted, which is moreover directly available generally, as a reference signal, so that the value of $\Omega_0 - \omega_0$ is to be sought in a pass-band $\Delta\omega$, defined by a filter having a power spectrum $F(\omega)$. Hence the frequencies and the values of N and of N' are related to band width $\Delta\omega$ taken as unity. The value expected of $(\omega_0 - \Omega_0)/\Delta\omega$ will be comprised between 0 and 1.

The above equations (1) and (2) enable the establishment, for each form $F(\omega)$ of the noise spectrum, of a universal nomogram valid for all values of $\omega_0$. This nomogram, of which FIG. 1 gives the example corresponding to a Gaussian filter and to Gaussian noise, enables, by simple plotting of measured data, the deduction of $(\omega_0 - \Omega_0)/\Delta\omega$ and a form N/$\Delta\omega$ and N'/$\Delta\omega$.

In FIG. 1, point 0 corresponds to noise without the presence of a signal, that is to say A=0. The straight line BC corresponds to N=N' and hence to a pure sine signal, for which $\sigma$=0. The lines starting from 0 correspond to constant values of $(\omega_0 - \Omega_0)/\Delta\omega$, ranging from 0.1 for the line OB to 1.0 for the line OC. The curves connecting the intermediate points of the lines OB and OC each correspond to one value of a=A/$\sigma$ (indicated in dB in FIG. 1).

The accuracy obtained by counting N and N' and subsequent determination of $\omega_0$ by calculation or by reference to a nomogram of the type shown in FIG. 1 can be estimated by numerical study of the variance of the counting rate of the signal and of its derivative. The variancies depend obviously on the signal/noise ratio and on the frequency, as well as on the duration T of the counting. These variances vary asymptotically as $T^{-1}$, which indicates that the accuracy increases with the duration of the counting.

For a given value of the couple ($\omega_0$, a) and duration T, the error committed on the estimation can be evaluated. The calculation enables in fact the establishment of the table of the accuracies $\epsilon_f$ and $\epsilon_a$ on frequency and the signal/noise ratio as a function of the counting time T, given in multiples $N_p$ of the number of periods $T = 2\pi/(\omega_0 - \Omega_0)$ of the signal. The table below gives the relative error $\epsilon_f$ after heterodyning, which is therefore equal to $\epsilon_f = \Delta\omega_0/(\omega_0 - \Omega_0)$; the table has the same character of universality as the nomogram of FIG. 1, for a given filter.

| A/$\theta$ | $N_p = 50$ | | $N_p = 100$ | | $N_p = 1000$ | |
| dB | $\epsilon_a$ | $\epsilon_f$ | $\epsilon_a$ | $\epsilon_f$ | $\epsilon_a$ | $\epsilon_f$ |
|---|---|---|---|---|---|---|
| −10 | 39 10$^{-4}$ | 28 10$^{-4}$ | 19 10$^{-4}$ | 11 10$^{-4}$ | 19 10$^{-5}$ | 11 10$^{-5}$ |
| −5 | 22 10$^{-4}$ | 12 10$^{-4}$ | 11 10$^{-4}$ | 60 10$^{-5}$ | 11 10$^{-5}$ | 60 10$^{-6}$ |
| 0 | 83 10$^{-5}$ | 42 10$^{-5}$ | 41 10$^{-5}$ | 21 10$^{-5}$ | 41 10$^{-6}$ | 21 10$^{-6}$ |
| 5 | 62 10$^{-6}$ | 43 10$^{-6}$ | 31 10$^{-6}$ | 21 10$^{-6}$ | 30 10$^{-7}$ | 21 10$^{-7}$ |
| 10 | — | 52 10$^{-8}$ | — | 11 10$^{-8}$ | — | — |

This possibility of determining by calculation the variances of the parameters measured as a function of the duration T of the measurement and, therefrom, the accuracy of the method, is a definite advantage to the method of the invention.

This method may be implemented with various devices. That shown in FIG. 2 has the advantage of being producible from commercially available components.

Figure 2:
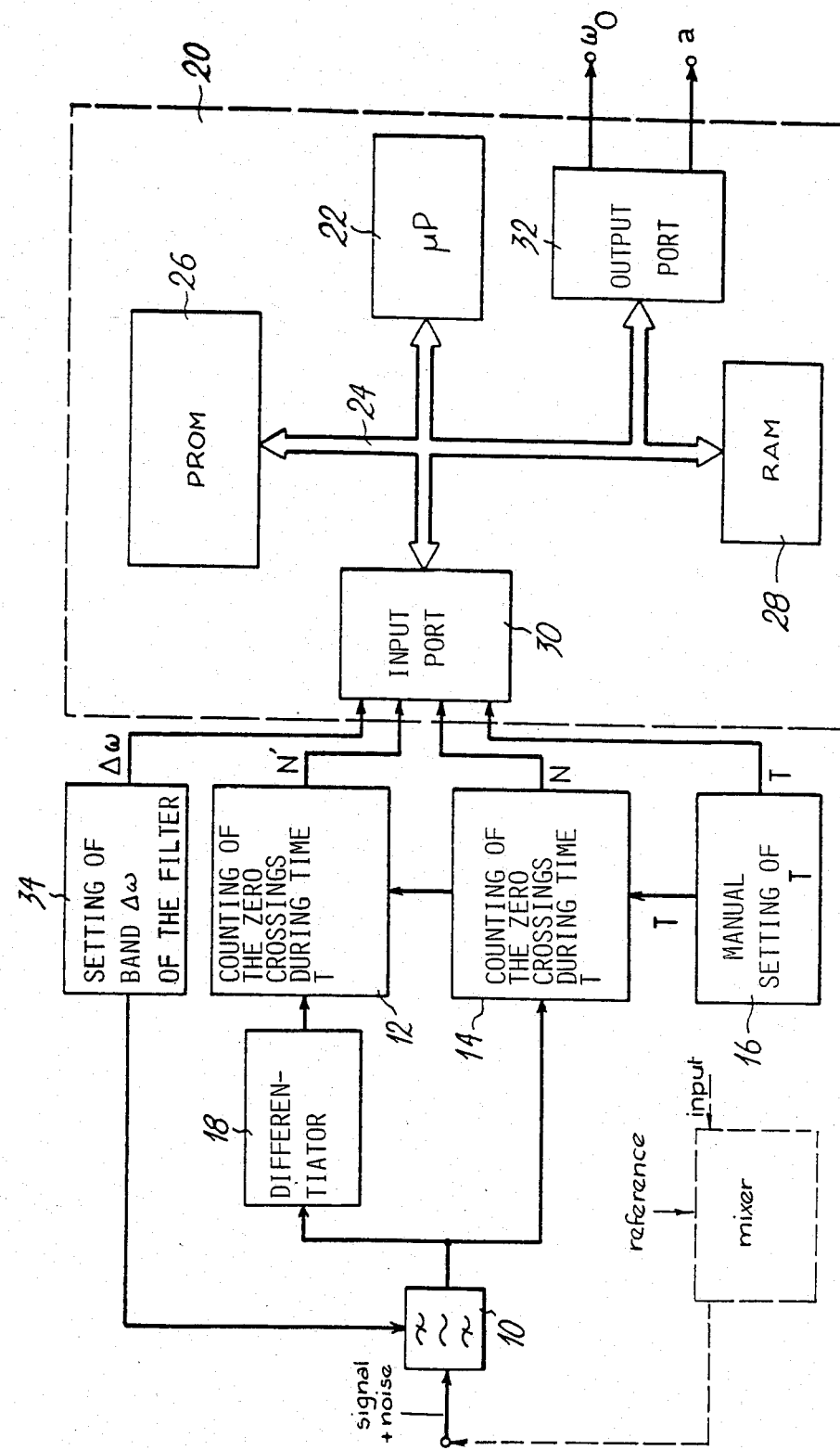
FIG. 2 is a block diagram of a device according to the invention for measuring the frequency of a noise-accompanied signal.

The device comprises an input filter 10, which receives the input noise and signal. In FIG. 2, it is shown as a band-pass filter having a band-pass $\Delta\omega$. When the device must be used for variable frequencies, this filter 10 could be a low-pass filter and follow a heterodyning circuit (in dotted line) enabling operation always close to zero in a narrow frequency band adjacent to zero. The transfer function $F(\omega)$ of the filter must be known, since it takes part in the determination of $\omega_0$ and a.

The output from the filter 10 is applied to two measuring arms in parallel relation, each comprising a counter 12 or 14 for counting the number of zero crossings during a same predetermined time period T which can be adjusted from a manual control panel 16. On one of the arms, an analogue differentiating circuit 18 is located before counter 12.

$\omega_0$ and a are determined by a digital unit 20 comprising a processing unit 22, which will generally be a micro-processor. The processing unit 22 is connected by the usual buses 24 to a programmable ROM 26, a main RAM 28, input ports 30 and output port 32. The read only memory 26 contains the initialization, execution and I/O management data. It further comprises computing algorithms which are directly derived from formulae (1) and (2) above and need not be described in detail, since in fact they reflect the chart of FIG. 1 in digital form. Each power spectrum $F(\omega)$ of the input filter 10 will be associated with a different set of coefficients. All the sets corresponding to various usable filters are stored in the ROM. A setting control 34 can be provided to permit band-pass $\Delta\omega$ selection and simultaneous change of the set of data used for calculation and stored in ROM 26.

The device which has just been described is operated in several successive steps, particularly when an approximate value only of $\omega_0$ is available at the beginning. Then a wide band-pass should be used. Several successive tests could be made to provide a coarse preliminary measurement, each time adopting a narrower band-pass for the filter 10. The sequence of preliminary measurements may be associated with changes in the frequency of a heterodyne reference generator. It is not necessary to describe in detail circuits for that result, considering that they are of a type available in the trade or well known in the art.

We claim:

1. A method for measuring the frequency of a sine shaped signal accompanied by noise of a known nature in an input signal, comprising the steps of: counting the number of zero crossings of said input signal during a predetermined time interval; generating the derivative or integral function of the input signal; counting the number of zero crossings of said function during said predetermined time interval; and computing the value of said frequency from the counts of said zero crossings of said input signal and of said function.

2. A method according to claim 1, wherein the input signal is subjected to band pass or low pass filtering before said zero crossings are counted.

3. A method according to claim 1, wherein said input signal is subjected to heterodyning by a sine shaped signal having a reference frequency $\Omega_0$ selected for the resulting frequency to be close to 0.

4. A method according to claim 3, further comprising the steps of preparing a chart providing a representation of the frequency as a function of the numbers of zero crossings of said input signal and the derivative thereof for each particular nature and noise spectrum after filtering and determining the frequency from said chart.

5. A method according to claim 1, comprising the additional step of determining the signal-to-noise ratio and the accuracy of the measurement from the numbers of zero crossings of said input signal and the derivative thereof.

6. A device for measuring the frequency of a sine shaped signal accompanied by a noise of a known nature in an input signal, comprising a first counter connected to receive said input signal and arranged to determine the number of zero crossings of said input signal for a predetermined time period, derivating means connected to receive said input signal and to deliver a derivated signal to a second counter for counting the number of zero crossings of said derivative for said predetermined time period, and digital computer means for determining said frequency and the signal-to-noise ratio of said input signal from said predetermined period and the number of zero crossings counted by both said first and second counters.

7. A device according to claim 6, further comprising a band pass or low pass filter connected to receive said input signal and to deliver said input signal in filtered form to said first counter for counting the number of zero crossings of said input signal and to said derivating means.

8. A device according to claim 7, wherein said digital processing means includes a programmable read only memory for storing characteristics of the nature and the noise spctrum of said input signal after filtering thereof.

9. A device according to claim 6, further comprising means for generating a reference frequency and means connected to receive said input signal and said reference frequency and for delivering the resulting signal to said first counter for counting the zero crossings of the resulting signal and to the derivating means, said reference frequency being selected for the signal delivered to said first counter and said derivator to have a frequency close to zero.

10. A device according to claim 9, for determining the frequency of an input signal comprised of an echo of a transmitted signal having a predetermined frequency, wherein said transmitted frequency constitutes said reference frequency.

11. A device according to claim 9, wherein said means connected to receive the input signal and the reference frequency is a mixer.

* * * * *